United States Patent
Seok et al.

(10) Patent No.: US 9,406,369 B2
(45) Date of Patent: Aug. 2, 2016

(54) MEMORY MODULE AND MANUFACTURING METHOD THEREOF

(71) Applicant: Samsung Electronics Co., Ltd., Suwon-si, Gyeonggi-do (KR)

(72) Inventors: Jong-Hyun Seok, Seoul (KR); Dohyung Kim, Hwaseong-si (KR); Kwangseop Kim, Yongin-si (KR); Young-Ho Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/325,867

(22) Filed: Jul. 8, 2014

(65) Prior Publication Data

US 2015/0078055 A1 Mar. 19, 2015

(30) Foreign Application Priority Data

Sep. 17, 2013 (KR) ........................ 10-2013-0111873

(51) Int. Cl.
*H01L 23/34* (2006.01)
*G11C 11/401* (2006.01)
*G11C 5/02* (2006.01)
*G11C 5/04* (2006.01)

(52) U.S. Cl.
CPC .............. *G11C 11/401* (2013.01); *G11C 5/025* (2013.01); *G11C 5/04* (2013.01)

(58) Field of Classification Search
CPC .............. G11C 5/04; G11C 5/06; G11C 5/14; G11C 5/025; G11C 5/066; G06F 13/4086

USPC ............................................. 365/63; 711/115
See application file for complete search history.

(56) References Cited

U.S. PATENT DOCUMENTS

| | | | | |
|---|---|---|---|---|
| 5,272,664 | A | * 12/1993 | Alexander et al. | 365/52 |
| 5,841,686 | A | * 11/1998 | Chu et al. | 365/51 |
| 5,941,447 | A | *  8/1999 | Chu et al. | 228/180.21 |
| 5,996,880 | A | * 12/1999 | Chu et al. | 228/180.21 |
| 6,202,110 | B1 |  3/2001 | Coteus et al. | |
| 6,850,414 | B2 |  2/2005 | Benisek et al. | |
| 6,930,904 | B2 | * 8/2005 | Wu | 365/72 |
| 7,254,675 | B2 | * 8/2007 | Lee et al. | 711/115 |
| 7,542,305 | B2 |  6/2009 | Petersen et al. | |
| 7,812,445 | B2 | * 10/2010 | Baek | G11C 5/04 257/686 |
| 7,919,841 | B2 |  4/2011 | Park et al. | |

(Continued)

FOREIGN PATENT DOCUMENTS

KR 1020030021901 A 3/2003

*Primary Examiner* — Richard Elms
*Assistant Examiner* — Xiaochun L Chen
(74) *Attorney, Agent, or Firm* — Harness, Dickey & Pierce, P.L.C.

(57) ABSTRACT

A memory module includes a printed circuit board; first memory chips disposed in parallel with a long axis of the printed circuit board along a first column; second memory chips disposed in parallel with the long axis of the printed circuit board along a second column; and passive elements disposed between the first memory chips and the second memory chips, wherein the passive elements are connected between input/output pins of each of the first and second memory chips and tap pins.

18 Claims, 4 Drawing Sheets

(56) References Cited

U.S. PATENT DOCUMENTS

| | | |
|---|---|---|
| 8,243,488 B2 | 8/2012 | Harashima et al. |
| 8,399,301 B2 | 3/2013 | Park et al. |
| 8,520,422 B2 | 8/2013 | Seok et al. |
| 2003/0002262 A1 | 1/2003 | Benisek et al. |
| 2003/0162130 A1 | 8/2003 | Murota |
| 2004/0024966 A1* | 2/2004 | Lee et al. ............... 711/115 |
| 2004/0100812 A1* | 5/2004 | Wu ............................ 365/72 |
| 2006/0056215 A1 | 3/2006 | Petersen et al. |
| 2007/0252271 A1* | 11/2007 | Baek ................. G11C 5/04 257/723 |
| 2008/0179649 A1 | 7/2008 | Park et al. |
| 2010/0067278 A1 | 3/2010 | Oh et al. |
| 2011/0096583 A1 | 4/2011 | Seok et al. |
| 2011/0165736 A1 | 7/2011 | Park et al. |
| 2012/0026772 A1 | 2/2012 | Harashima et al. |

\* cited by examiner

MEMORY MODULE AND MANUFACTURING METHOD THEREOF

CROSS-REFERENCE TO RELATED APPLICATIONS

A claim for priority under 35 U.S.C. §119 is made to Korean Patent Application No. 10-2013-0111873 filed Sep. 17, 2013, in the Korean Intellectual Property Office, the entire contents of which are hereby incorporated by reference.

BACKGROUND

Example embodiments of the inventive concepts described herein relate to a memory module and a method of manufacturing the memory module.

A memory module where a plurality of memory chips is mounted on a printed circuit board (PCB) is divided into a Single Inline Memory Module (SIMM) and a Double In-line Memory Module (DIMM). The same signals are applied to both surfaces of the PCB of the SIMM, and different signals are applied to both surfaces of the PCB of the DIMM. The DIMM is divided into a registered DIMM and a fully buffered DIMM (FBDIMM). In the registered DIMM, since the modules are connected in parallel to a bus of a memory system, the number of modules that are connectable may be restricted. Thus, the registered DIMM may have a limited capacity. In case of the FBDIMM, since a mother board chipset and an Advanced Memory Buffer (AMB) of the FBDIMM are connected in a point-to-point manner, the number of modules that may be connected to the memory system may increase. Thus, the capacity of the FBDIMM may not be limited due to the number of connectable modules. Also, the FBDIMM operates in high speed using a packet protocol.

In a conventional memory module, passive elements may be disposed between a tap and memory chips. In this case, mechanical defects (e.g., crack, short, etc.) in the passive elements may be generated due to the physical force exerted on the passive elements when the tap of the memory module is inserted in a socket.

SUMMARY

One or more example embodiments of the inventive concepts are directed to provide a memory module.

In one or more example embodiments, the memory module may include a printed circuit board; first memory chips disposed in parallel with a long axis of the printed circuit board along a first column; second memory chips disposed in parallel with the long axis of the printed circuit board along a second column; and passive elements disposed between the first memory chips and the second memory chips, wherein the passive elements are connected between input/output pins of each of the first and second memory chips and tap pins.

In one or more example embodiments, the printed circuit board includes a plurality of layers, and the first memory chips and the second memory chips are disposed on an uppermost or lowermost layer of the plurality of layers.

In one or more example embodiments, the input/output pins of each of the first and second memory chips are disposed in a direction perpendicular to the long axis.

In one or more example embodiments, the input/output pins of each of the first and second memory chips are disposed in a direction parallel with the long axis.

In one or more example embodiments, the passive elements include capacitors.

In one or more example embodiments, the passive elements include input/output resistors.

In one or more example embodiments, when the memory module is inactivated, the tap pins and the input/output resistors are electrically connected.

In one or more example embodiments, the input/output resistors are the first column of first memory chips and the second column of second memory chips.

In one or more example embodiments, the input/output resistors are between at least two of the first memory chips in the first column or between at least two of the second memory chips in the second column.

In one or more example embodiments, the memory module further includes a first signal line connected between one of the tap pins and one of the input/output resistors; a second signal line connected between the one input/output resistor and a divergence point; and third signal lines connected between the divergence point and at least two input/output pins, and wherein the at least two input/output pins are included in different memory chips.

In one or more example embodiments, at least one of the first memory chips and at least one of the second memory chips are disposed to form point symmetry on the basis of at least one of the passive elements.

In one or more example embodiments, the memory module further includes a hub controller configured to control the first and second memory chips.

One or more example embodiments of the inventive concepts are directed to provide a method of manufacturing a memory module, the method comprising mounting a first column of first memory chips along a long axis of a printed circuit board; mounting a second column of second memory chips along the long axis of the printed circuit board; and mounting passive elements between the first column of first memory chips and the second column of second memory chips.

In one or more example embodiments, the second memory chips are mounted to form point symmetry to the first memory chips on the basis of the passive elements.

In one or more example embodiments, each of the first and second memory chips is a synchronous DRAM.

At least one example embodiment relates to a memory module.

In one or more example embodiments, the memory module may include a plurality of active elements arranged in a first column and a second column along a first axis of a printed circuit board, the printed circuit board including tap pins configured to fit into a socket and the plurality of active elements including input/output (I/O) pins electrically connected to the tap pins; a first column of active elements disposed along a first axis of a printed circuit board; a second column of active elements disposed along the first axis parallel to the first column of active elements; and passive electrical components electrically connected between I/O pins and the tap pins, the passive electrical components disposed between the first column and the second column of active elements such that one of the first column and the second column of active elements is disposed between the passive electrical components and the tap pins.

In one or more example embodiments, the passive electrical components are configured to vary an impedance of signal lines connected between the memory chips and the tap pins such that a signal reflection therebetween is reduced.

In one or more example embodiments, the passive electrical components include one or more of resistors and capacitors that are disposed between the first column of memory chips and the second column of memory chips.

In one or more example embodiments, at least one of the memory chips in the first column and the second column is configured to perform an error correction function.

In one or more example embodiments, the passive elements do not contact the socket when the memory module is inserted therein.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Example embodiments will be described in detail with reference to the accompanying drawings. The inventive concepts, however, may be embodied in various different forms, and should not be construed as being limited only to the illustrated example embodiments. Rather, these example embodiments are provided as examples so that this disclosure will be thorough and complete, and will fully convey the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A memory module according to the inventive concepts may include passive elements disposed between first memory chips disposed along a first column parallel with a long axis of a printed circuit board and second memory chips disposed on the first memory chips along a second column, to reduce mechanical defects of the passive elements due to a physical force.

Figure 1:
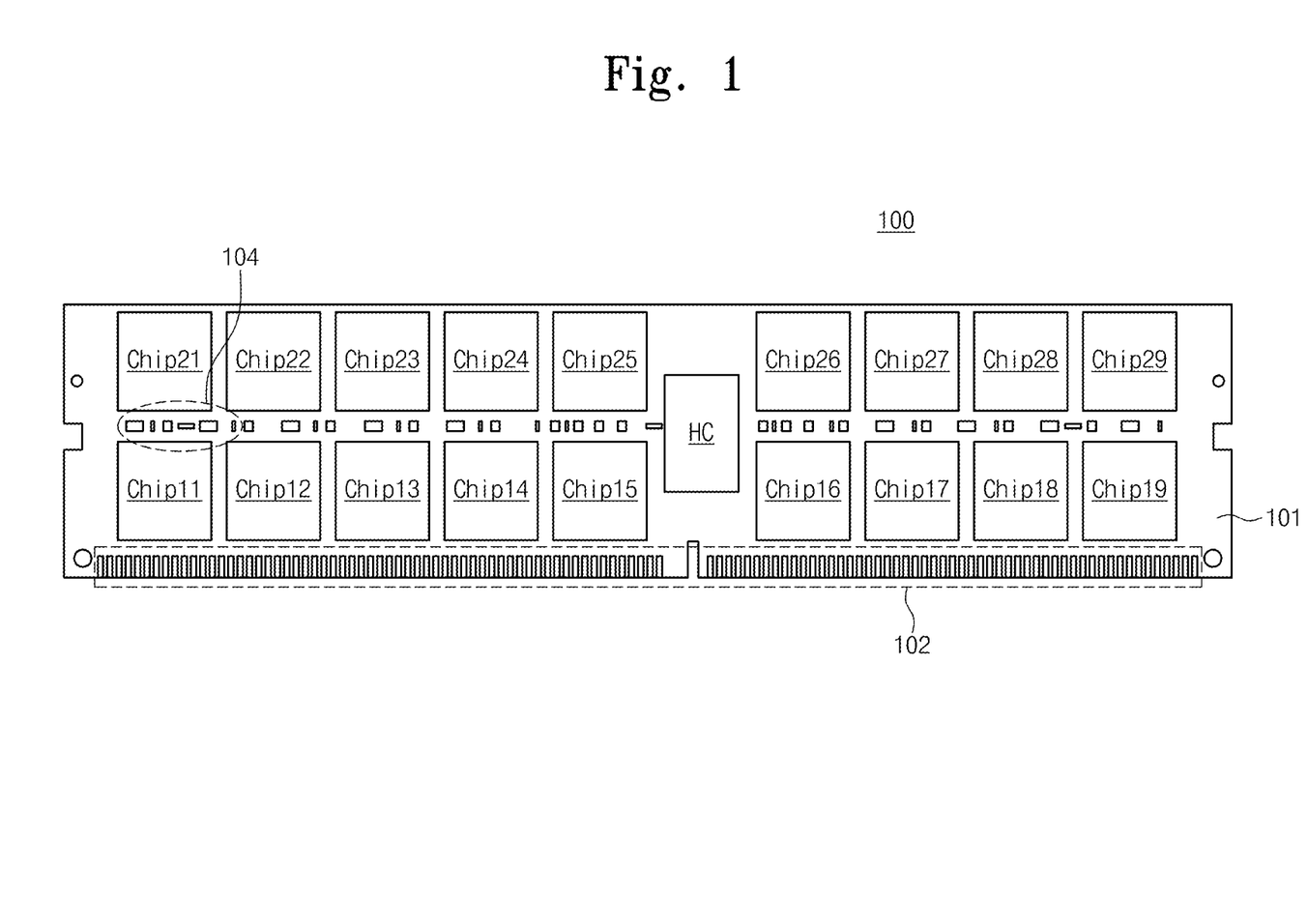
FIG. 1 is a diagram schematically illustrating an outward form of a memory module 100 according to an example embodiment of the inventive concepts.

FIG. 1 is a diagram schematically illustrating an outward form of a memory module 100 according to an example embodiment of the inventive concepts.

Referring to FIG. 1, a memory module 100 includes a plurality of active elements CHIP11 to CHIP19 and CHIP21 to CHIP29 arranged on a printed circuit board (PCB) 101 along two columns. The active elements may each be a memory chip, however, example embodiments are not limited thereto.

The memory module 100 may be implemented by a DIMM (dual in-line memory module), SO-DIMM (small outline DIMM), RDIMM (ECC Registered DIMM), UDIMM (ECC Unbuffered DIMM), FBDIMM (fully buffered DIMM), RIMM (Rambus in-line memory module), or SIMM (single in-line memory module).

The PCB 101, although not shown, may be formed of a plurality of layers. Here, signal lines for electrically connecting the memory chips CHIP11 to CHIP19 and CHIP21 to CHIP29 to a tap 102 may be formed within the plurality of layers of the PCB 101. The tap 102 is formed of a plurality of pines (also referred to as tap pins) that may be inserted in an external socket. The signal lines may transfer power, control signals, address signals, input/output data signals, etc.

In example embodiments, two columns of the memory chips CHIP11 to CHIP19 and CHIP21 to CHIP29 arranged along a long axis of the PCB 101 are disposed on a surface layer (or, an uppermost layer and/or a lowermost layer) of the PCB 101. However, example embodiments are not limited thereto.

In example embodiments, passive elements 104 are disposed between the memory chips CHIP11 to CHIP19 in the first column and the memory chips CHIP21 to CHIP29 in the second column such that the passive elements 104 are not directly next to the taps 102 In other words, there exists at least one column of active elements between the passive elements 104 and the tap 102. For example, the passive elements may be input/output resistors and/or capacitors which are disposed between the memory chips CHIP11 to CHIP19 in the first column and the memory chips CHIP21 to CHIP29 in the second column. Here, the input/output resistors may be connected to signal lines for transferring input/output signals of a memory chip. The input/output resistors may be used to prevent such a signal reflection phenomenon known as overshoot.

The passive elements 104 may be disposed between the memory chips CHIP11 to CHIP19 in the first column and the memory chips CHIP21 to CHIP29 in the second column along a long axis direction (or, a horizontal direction) of the memory module 100. However, example embodiments are not limited thereto.

For example, the passive elements 104 may be disposed between the memory chips CHIP11 to CHIP19 in the first column or between the memory chips CHIP21 to CHIP29 in the second column along a short axis direction (or, a vertical direction) of the memory module 100. Alternatively, the passive elements 104 may be disposed between the memory chips CHIP11 to CHIP19 in the first column and the memory chips CHIP21 to CHIP29 in the second column along a long axis direction of the memory module 100, or are disposed between the memory chips CHIP11 to CHIP19 in the first column or between the memory chips CHIP21 to CHIP29 in the second column along a short axis direction of the memory module 100.

Each of the memory chips CHIP11 to CHIP19 and CHIP21 to CHIP29 may be formed of DRAM, SRAM, SDRAM, MRAM, or the like.

In some example embodiments, input/output pins of each of the memory chips CHIP11 to CHIP19 and CHIP21 to CHIP29 may be disposed to have a vertical structure on the basis of a long axis of the memory module 100. In other example embodiments, input/output pins of each of the memory chips CHIP11 to CHIP19 and CHIP21 to CHIP29 may be disposed to have a horizontal structure on the basis of a long axis of the memory module 100. However, example embodiments of the inventive concepts are not limited thereto.

At least one of the memory chips CHIP11 to CHIP19 in the first column or at least one of the memory chips CHIP21 to CHIP29 in the second column may perform an error correction function.

FIG. 1 illustrates an example embodiment where the number of memory chips CHIP11 to CHIP19 in the first column and the number of memory chips CHIP21 to CHIP29 in the second column are 9. However, example embodiments of the inventive concepts are not limited thereto.

The memory module 100 may further include a hub controller HC for controlling the memory chips CHIP11 to CHIP19 and CHIP21 to CHIP29 or an advanced memory buffer (AMB). However, the hub controller HC may be excluded from the memory module 100 of one or more example embodiments of the inventive concepts.

The hub controller HC receives a data packet from an external memory controller. The hub controller HC converts the input data packet into control signals, an address, and data to transfer them to the memory chips CHIP11 to CHIP19 and CHIP21 to CHIP29. The hub controller HC generates a packet on data output from each of the memory chips CHIP11 to CHIP19 and CHIP21 to CHIP29 and outputs the packet to the external memory controller.

The memory module 100 may reduce the probability of mechanical defects being generated when the memory module 100 is inserted in a socket, by disposing the passive elements between the memory chips CHIP11 to CHIP19 in the first column and the memory chips CHIP21 to CHIP29 in the second column.

Figure 2:
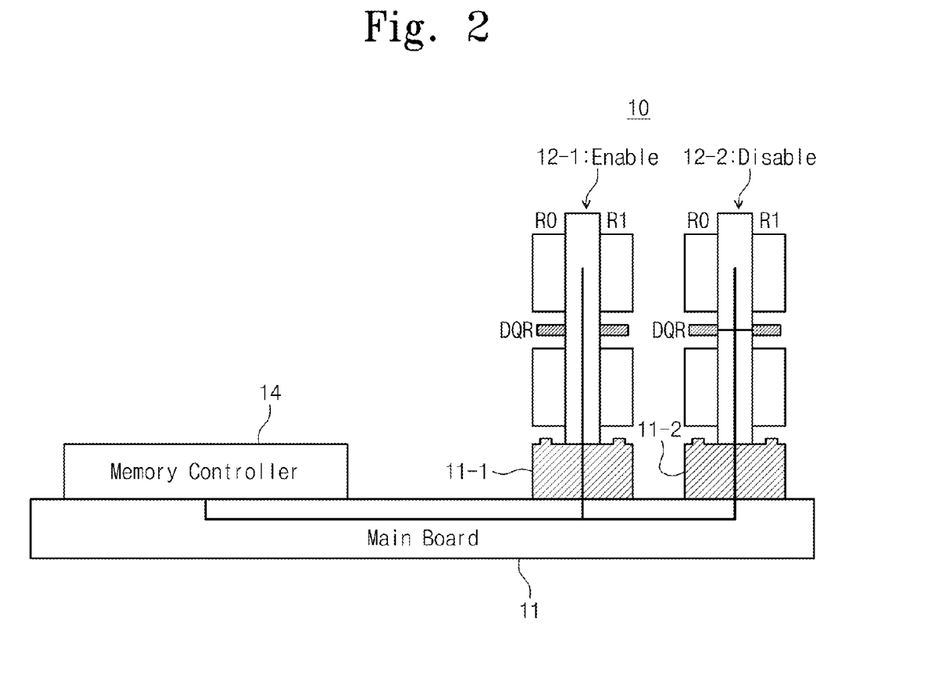
FIG. 2 is a diagram conceptually describing a function of an input/output resistor DQR according to an example embodiment of the inventive concepts.

FIG. 2 is a diagram conceptually describing a function of an input/output resistor DQR according to an example embodiment of the inventive concepts.

Referring to FIG. 2, a memory system 10 includes memory modules 12-1 and 12-2 inserted in sockets 11-1 and 11-2, respectively. The sockets 11-1 and 11-2 are mounted on a main board 11. A memory controller 14 is also mounted on the main board 11. Each of the memory modules 12-1 and 12-2 may be implemented by a memory module 100 shown in FIG. 1. For ease of description, it is assumed that the first memory module 12-1 is activated and the second memory module 12-2 is inactivated (e.g., at a test mode).

To reduce a signal reflection phenomenon at driving, in case of the inactivated memory module 12-2, an associated input/output resistor DQR may be electrically connected to an input/output signal line. On the other hand, in the case of the activated memory module 12-1, an associated input/output resistor DQR may not be electrically connected to an input/output signal line.

In example embodiments, in each of the memory modules 12-1 and 12-2, memory chips may be disposed on a surface layer (or, an uppermost layer and/or a lowermost layer) of a PCB 101 (refer to FIG. 1). For example, each of the memory modules 12-1 and 12-2 may include a first rank of memory chips R0 formed on a first surface layer of the PCB 101 and a second rank of memory chips R1 formed on a layer opposite to the first surface layer. Each of the first and second ranks of memory chips R0 and R1 may include a plurality of memory chips.

In example embodiments, in each of the memory modules 12-1 and 12-2, input/output resistors (e.g., DQR) may be disposed on one or more of the uppermost and lowermost layers of the PCB 101.

Figure 3:
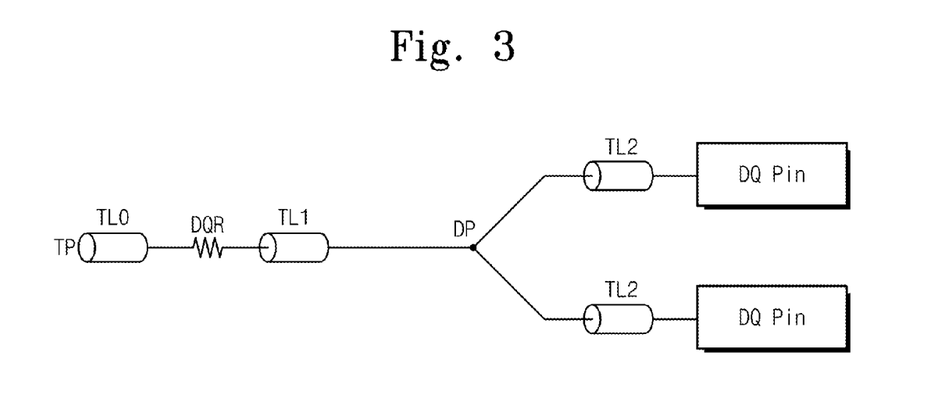
FIG. 3 is a diagram schematically illustrating a signal line between a tap pin TP and an input/output pin DQ Pin, according to an example embodiment of the inventive concepts.

FIG. 3 is a diagram schematically illustrating a signal line between a tap pin TP and an input/output pin DQ Pin, according to an example embodiment of the inventive concepts.

Referring to FIG. 3, it is assumed that a sum (TL0+TL1+TL2) of signal lengths has the same value (e.g., 28.3 mm).

A first signal length TL0 is a length between tap pin TP and an input/output resistor DQR, a second signal length TL1 is a length between the input/output resistor DQR and a divergence point DP. The signal line diverges at the divergence point DP into input/output pins respectively corresponding to memory chips, and each of third signal lengths TL2 is a length between the divergence point DP and one of the input/output pin DQ Pins. Here, the third signal lengths TL2 may be connected to input/output pins DQ Pin of different memory chips. In example embodiments, the first, second and third signal lines TL0, TL1 and TL2 may be formed on at least one internal layer of a PCB 101 shown in FIG. 1.

In example embodiments, the input/output resistor DQR may be connected to input/output pins of different ranks R0 and R1.

In FIG. 3, there is illustrated an embodiment where the third signal lines TL2 diverge into two different memory chips from the divergence point DP. However, example embodiments of the inventive concepts are not limited thereto. For example, the third signal lines TL2 may diverge into three or more different memory chips from the divergence point DP.

In example embodiments the inventive concepts, a simulation result of the potential energy (UI) according to a variation in signal length and frequency shows a variation in the UI according to a change of the first signal length TL0 at different operating frequencies. For example, when an operating frequency is relatively low, the UI slowly decreases according to an increase in the first signal length TL0. When an operating frequency is relatively high, the UI is maintained at a constant value regardless of whether the first signal length TL0 is varied. This may mean that an UI characteristic is maintained although the first signal length TL0 is spaced apart from the tap pin TP to a certain degree. That is, a characteristic of an input/output signal is improved by adjusting the first signal length TL0. For example, an impedance of the signal line may be improved such that the signal reflection phenomenon is reduced.

In example embodiments of the inventive concepts, a simulation result on UI according to a variation in signal length and input/output resistor DQR shows that UI is relatively higher regardless of the first signal length TL1 in proportion to an increase in resistance value of the input/output resistor DQR. That is, a characteristic of an input/output signal is improved by appropriately selecting a resistance value of the input/output resistor DQR.

The memory chips of a memory module may be disposed on the PCB 101 using various methods. For example, in one or more example embodiments, a memory chip in a first column and a memory chip in a second column may be disposed to form point symmetry on the basis of the input/output resistor DQR.

Figure 4:
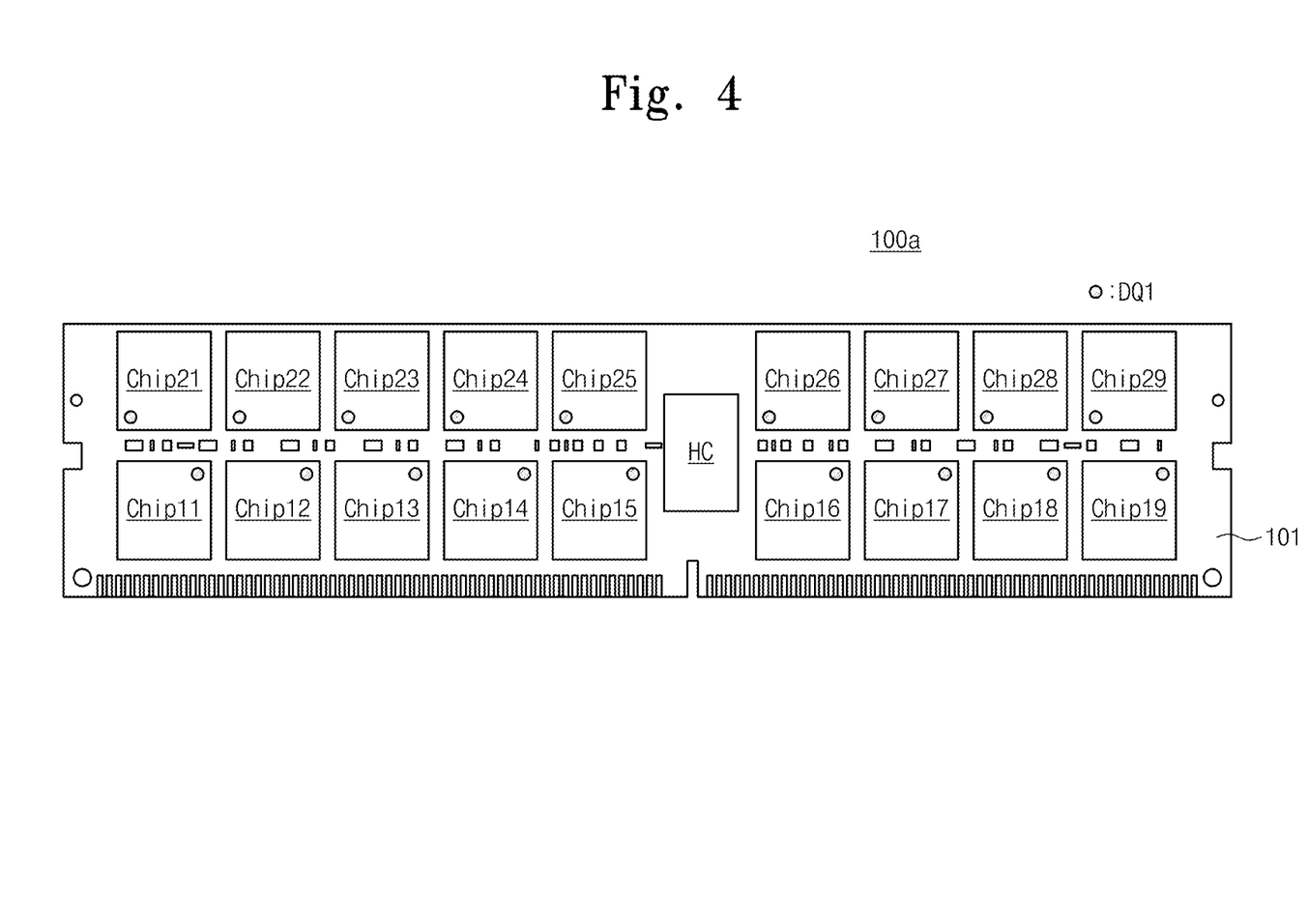
FIG. 4 is a diagram schematically illustrating an outward form of a memory module 100a according to another example embodiment of the inventive concepts.

FIG. 4 is a diagram schematically illustrating an outward form of a memory module 100a according to another example embodiment of the inventive concepts.

Referring to FIG. 4, input/output resistors DQR are disposed between a first column of memory chips CHIP11 to CHIP19 and a second column of memory chips CHIP21 to CHIP29, and the first column of memory chips CHIP11 to CHIP19 and the second column of memory chips CHIP21 to CHIP2 are disposed to form point symmetry on the basis of each of the input/output resistors DQR. Thus, a first input/output pin DQ1 of a first memory chip CHIP11 in the first column and a first input/output pin DQ1 of a second memory chip CHIP21 in the second column are disposed to form point symmetry on the basis of the input/output resistor DQR.

Input/output pins of each of the memory chips CHIP11 to CHIP19 and CHIP21 to CHIP29 may be disposed on a PCB 101 of memory chips to be adjacent to input/output resistors DQR.

In the memory module 100a, at least one of the first memory chips CHIP11 to CHIP19 and at least one of the second memory chips CHIP21 to CHIP29 may be disposed to form point symmetry on the basis of at least one of the passive elements.

Figure 5:
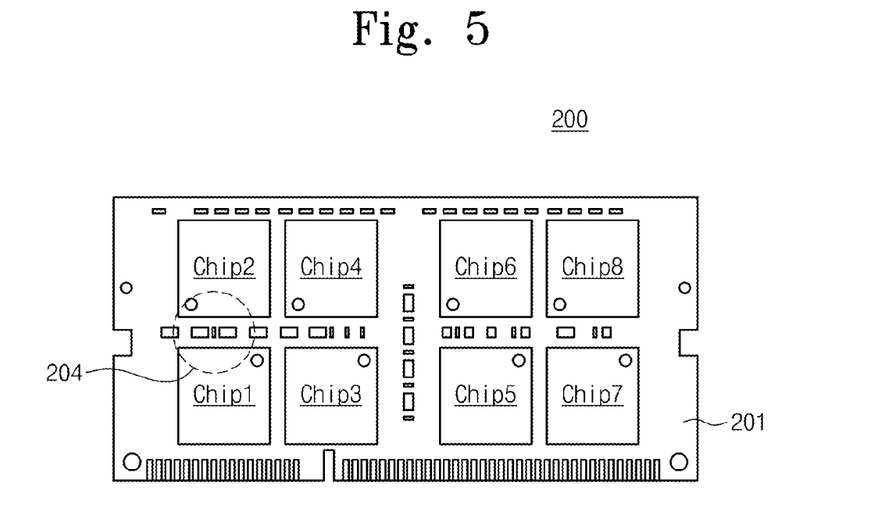
FIG. 5 is a diagram schematically illustrating an outward form of SODIMM 200 according to an example embodiment of the inventive concepts.

FIG. 5 is a diagram schematically illustrating an outward form of a small outline DIMM (SODIMM) 200 according to an example embodiment of the inventive concepts.

Referring to FIG. 5, a SODIMM 200 may include eight memory chips CHIP1 to CHIP8 that are disposed along two columns. Input/output pins of each of the memory chips CHIP1 to CHIP8 are disposed to have a horizontal or vertical structure along a long axis of the SODIMM 200.

Passive elements 204 are disposed between a first column of memory chips CHIP1, CHIP3, CHIP5, and CHIP7 and a second column of memory chips CHIP2, CHIP4, CHIP6, and CHIP8. However, example embodiments are not limited thereto. For example, although not shown in FIG. 5, the passive elements 204 may be disposed between memory chips (e.g., CHIP1 and CHIP3) in the same column.

Figure 6:
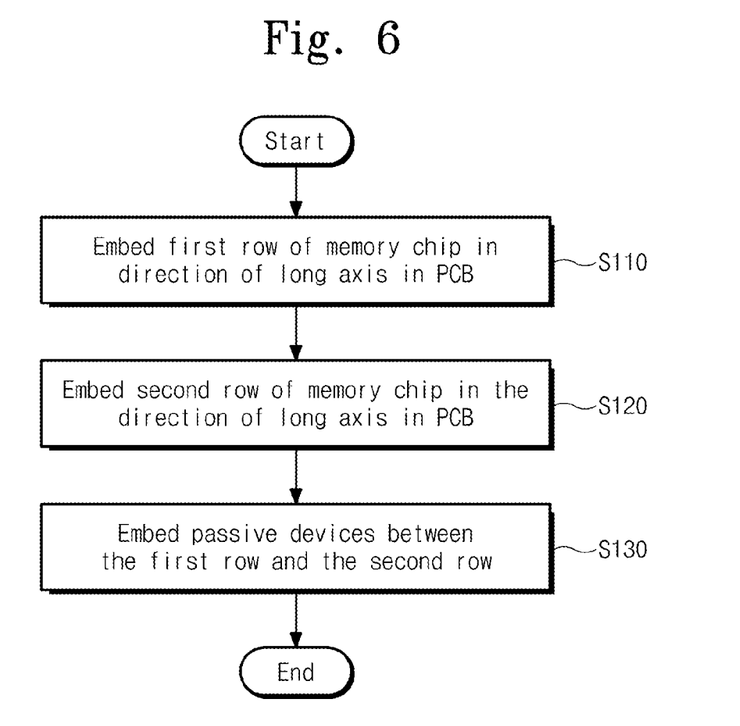
FIG. 6 is a flow chart illustrating a memory module manufacturing method according to an example embodiment of the inventive concepts.

FIG. 6 is a flow chart illustrating a memory module manufacturing method according to an example embodiment of the inventive concepts.

Referring to FIGS. 1 to 6, in operation S110 of a memory module manufacturing method according to an example embodiment, a first column of first memory chips may be mounted on a PCB 101 in a long axis direction.

In operation S120, a second column of second memory chips may be mounted on the PCB 101 in the long axis direction.

In operation S130, passive elements are mounted between the first column of first memory chips and the second column of second memory chips. Therefore, mechanical defects caused when a memory module is inserted in a socket may be reduced by mounting the passive elements between the first column of first memory chips and the second column of second memory chips.

While FIGS. 1 to 6 illustrate the memory chips disposed along two columns, the example embodiments of the inventive concepts are not limited thereto. For example, a memory module may be implemented such that memory chips are disposed along three or more columns.

While example embodiments of the inventive concepts has been described with reference to example embodiments, it will be apparent to those skilled in the art that various changes and modifications may be made without departing from the spirit and scope of the present invention. Therefore, it should be understood that the above example embodiments are not limiting, but illustrative.

What is claimed is:

1. A memory module comprising:
    a printed circuit board (PCB) having a first surface and a second surface;
    first memory chips on the first surface of the PCB in a first column that is parallel with a long axis of the PCB;
    second memory chips on the first surface of the PCB in a second column that is parallel with the long axis of the PCB; and
    passive elements on the first surface along the long axis between the first column and the second column, the passive elements being connected between input/output pins of each of the first and second memory chips and tap pins, the passive elements including input/output resistors electrically connected between the input/output pins and the tap pins, the input/output resistors being configured to,
electrically connect to the tap pins, if the memory module is inactivated, and
electrically disconnect from the tap pins, if the memory module is activated.

2. The memory module of claim 1, wherein the printed circuit board comprises:
a plurality of layers, the plurality of layers having the first memory chips and the second memory chips on an uppermost or lowermost layer thereof.

3. The memory module of claim 1, wherein the input/output pins of each of the first and second memory chips are in a direction perpendicular to the long axis.

4. The memory module of claim 1, wherein the input/output pins of each of the first and second memory chips are in a direction parallel with the long axis.

5. The memory module of claim 1, wherein the passive elements further comprise:
capacitors electrically connected between the input/output pins and the tap pins.

6. The memory module of claim 1, wherein the input/output resistors are between the first column of the first memory chips and the second column of the second memory chips.

7. The memory module of claim 1, wherein the input/output resistors are between at least two of the first memory chips in the first column or between at least two of the second memory chips in the second column in a direction perpendicular to the long axis.

8. The memory module of claim 1, further comprising:
a first signal line connected between one of the tap pins and one of the input/output resistors;
a second signal line connected between the one of the input/output resistor and a divergence point; and
third signal lines connected between the divergence point and one of a first one of the input/output pins and a second one of the input/output pins, the first one of the input/output pins being included in a different one of the memory chips from the second one of the input/output pins.

9. The memory module of claim 1, wherein at least one of the first memory chips and at least one of the second memory chips form point symmetry on the basis of at least one of the passive elements.

10. The memory module of claim 1, further comprising:
a hub controller configured to control the first and second memory chips.

11. A method of manufacturing a memory module, comprising:
mounting first memory chips on a first surface of a printed circuit board in a first column along a long axis of the printed circuit board;
mounting second memory chips on the first surface of the printed circuit board in a second column along the long axis of the printed circuit board; and
mounting passive elements on the first surface along the long axis between the first column and the second column, the passive elements including input/output resistors electrically connected between input/output pins of each of the first and second memory chips and tap pins, the input/output resistors being configured to
electrically connect to the tap pins, if the memory module is inactivated, and
electrically disconnect from the tap pins, if the memory module is activated.

12. The method of claim 11, wherein the second memory chips are mounted and the first memory chips are mounted such that there exists point symmetry therebetween about the passive elements.

13. The method of claim 11, wherein each of the first and second memory chips is a synchronous DRAM.

14. A memory module comprising:
a plurality of active elements on a first surface of a printed circuit board in a first column and a second column along a long axis of the printed circuit board, the printed circuit board including tap pins configured to fit into a socket and the plurality of active elements including input/output (I/O) pins electrically connected to the tap pins; and
passive electrical components electrically connected between the I/O pins and the tap pins, the passive electrical components mounted on the first surface along the long axis between the first column and the second column of active elements such that one of the first column and the second column of active elements is between the passive electrical components and the tap pins, the passive electrical components including input/output resistors electrically connected between the I/O pins and the tap pins, the input/output resistors being configured to
electrically connect to the tap pins, if the memory module is inactivated, and
electrically disconnect from the tap pins, if the memory module is activated.

15. The memory module of claim 14, wherein the passive electrical components are configured to vary an impedance of signal lines connected between the active elements and the tap pins such that a signal reflection therebetween is reduced.

16. The memory module of claim 15, wherein the active elements are memory chips, and
the passive electrical components further include capacitors between the first column of memory chips and the second column of memory chips.

17. The memory module of claim 16, wherein the plurality of memory chips are configured to communicate data to the tap via an Advanced Memory Buffer (AMB).

18. The memory module of claim 14, wherein all of the passive elements are mounted on the first surface further from the tap than at least one column of the active elements such that the passive elements do not contact the socket when the memory module is inserted therein.

* * * * *